(12) United States Patent
Lim

(10) Patent No.: US 8,971,135 B2
(45) Date of Patent: Mar. 3, 2015

(54) SEMICONDUCTOR MEMORY DEVICE RECEIVING DATA IN RESPONSE TO DATA STROBE SIGNAL, MEMORY SYSTEM INCLUDING THE SAME AND OPERATING METHOD THEREOF

(71) Applicant: SK Hynix Inc., Gyeonggi-do (KR)

(72) Inventor: Sang Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/910,502

(22) Filed: Jun. 5, 2013

(65) Prior Publication Data

US 2013/0322192 A1 Dec. 5, 2013

(51) Int. Cl.
  G11C 7/00 (2006.01)
  G11C 8/18 (2006.01)
  G11C 7/22 (2006.01)
  G11C 7/10 (2006.01)

(52) U.S. Cl.
  CPC .. *G11C 8/18* (2013.01); *G11C 7/22* (2013.01); *G11C 7/1057* (2013.01); *G11C 7/1066* (2013.01); *G11C 7/1084* (2013.01); *G11C 7/1093* (2013.01); *G11C 7/222* (2013.01)

USPC .......................................... 365/193; 365/191

(58) Field of Classification Search
  None
  See application file for complete search history.

(56) References Cited

U.S. PATENT DOCUMENTS 6,308,244 B1 * 10/2001 Katayama ..................... 711/148
7,746,711 B2 * 6/2010 Inaba ............................. 365/193

FOREIGN PATENT DOCUMENTS

KR    1020030041070    5/2003
KR      100780595    11/2007
KR    1020110012384    2/2011

* cited by examiner

*Primary Examiner* — Kretelia Graham
(74) *Attorney, Agent, or Firm* — IP & T Group LLP

(57) ABSTRACT

A semiconductor memory device includes an input/output circuit configured to receive an address and data from an exterior, and a peripheral circuit configured to receive the address through the input/output circuit and generate a chip selection signal based on the address. The input/output circuit may include a control pad circuit configured to apply or block at least one data strobe signal in response to the chip selection signal, and one or more input/output pad circuits configured to transfer the data to the peripheral circuits in response to the at least one data strobe signal.

15 Claims, 7 Drawing Sheets

US 8,971,135 B2

SEMICONDUCTOR MEMORY DEVICE RECEIVING DATA IN RESPONSE TO DATA STROBE SIGNAL, MEMORY SYSTEM INCLUDING THE SAME AND OPERATING METHOD THEREOF

CROSS-REFERENCE TO RELATED APPLICATION

Priority is claimed to Korean patent application number 10-2012-0060505, filed on Jun. 5, 2012, the entire disclosure of which is incorporated herein by reference in its entirety.

BACKGROUND

1. Field of Invention

Exemplary embodiments of the present invention relate to a semiconductor design technology, and more particularly, to a semiconductor memory device receiving a data strobe signal.

2. Description of Related Art

A semiconductor memory device is a memory device embodied by using a semiconductor material such as silicon (Si) germanium (Ge), gallium arsenide (GaAs), or indium phosphide (InP). Typically, a semiconductor memory device may be either a volatile memory device or a non-volatile memory device.

Volatile memory devices may not retain data stored therein when not powered. Examples of the volatile memory devices may include a static RAM (SRAM), a dynamic RAM (DRAM), and a synchronous DRAM (SDRAM). On the other hand, non-volatile memory devices may retain the stored data even when not powered. Examples of non-volatile memory devices may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM). There are two main types of flash memory: NOR and NAND.

A plurality of semiconductor memory devices may be coupled to a controller configured to control them through a single common channel. The controller may select one of the semiconductor memory devices coupled to the single common channel and access the selected semiconductor memory device.

BRIEF SUMMARY

Exemplary embodiments of the present invention are directed to a semiconductor memory device receiving a data strobe signal with reduced power consumption, a memory system including the same, and an operating method thereof.

A semiconductor memory device according to an embodiment of the present invention may include an input/output circuit configured to receive an address and data from the exterior, and a peripheral circuit configured to receive the address through the input/output circuit and generate a chip selection signal based on the address. The input/output circuit may include a control pad circuit configured to apply or block at least one data strobe signal in response to the chip selection signal, and one or more input/output pad circuits configured to transfer the data to the peripheral circuit in response to the at least one data strobe signal.

A memory system according to another embodiment of the present invention may include a first semiconductor memory group including semiconductor memory devices coupled to a first common channel, and a controller configured to transfer an address and data to semiconductor memory devices through the first common channel. Each of the semiconductor memory devices includes a peripheral circuit configured to generate a chip selection signal in response to the address, and an input/output circuit configured to transfer the data to the peripheral circuit in response to a data strobe signal and selectively block the data strobe signal in response to the chip selection signal.

A method of operating each of semiconductor memory devices coupled to a common channel according to another embodiment of the present invention may include receiving an address including one or more bits indicating one of the semiconductor memory devices, enabling the chip selection signal in response to the one or more bits, internally blocking a data strobe signal in response to the chip selection signal, and internally blocking data received from an exterior in response to the data strobe signal.

DESCRIPTION OF EMBODIMENTS

Hereinafter, various embodiments of the present invention will be described in detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

It will be understood that when an element is referred to as being "coupled" or "connected" to another element, it can be directly coupled or connected to the other element(s) or coupled or connected with intervening element(s) present. In contrast, when an element is referred to as being "directly coupled" or "directly connected" to another element, there are no intervening elements present. Other words used to describe the relationship between elements should be interpreted in like fashion (i.e., "between" versus "directly between", "adjacent" versus "directly adjacent", etc.).

Figure 1:
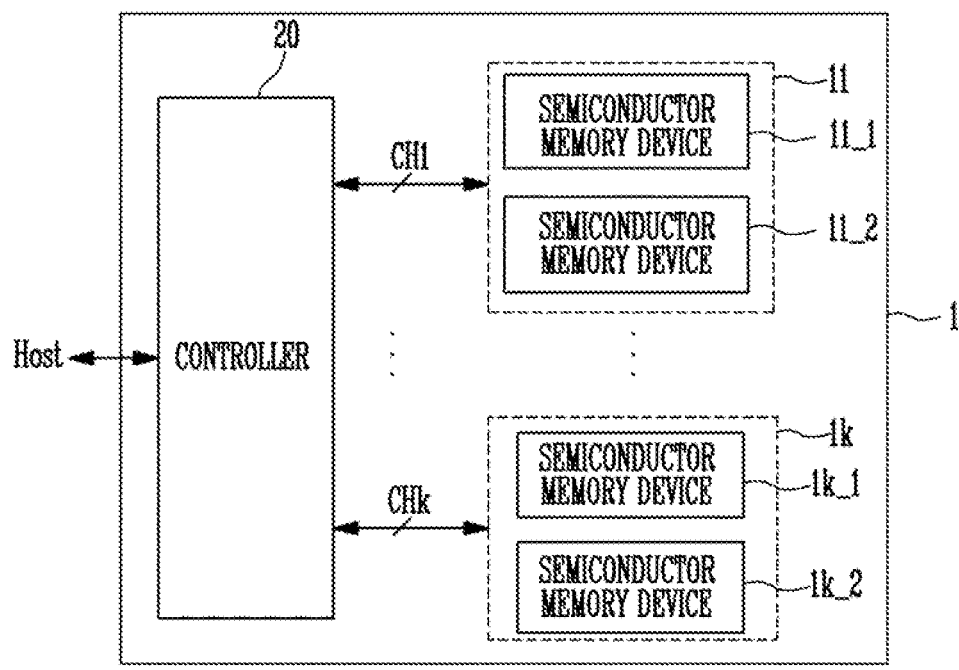
FIG. 1 is a block diagram illustrating a memory system including a plurality of semiconductor memory devices.

FIG. 1 is a block diagram illustrating a memory system that includes a plurality of semiconductor memory devices.

Referring to FIG. 1, the memory system 1 may include a plurality of semiconductor memory groups 11 to 1k and a controller 20. The first to k-th semiconductor memory groups 11 to 1k may be coupled to the controller 20 through first to k-th channels CH1 to CHk, respectively.

Each of the semiconductor memory groups may include a plurality of semiconductor memory devices. In FIG. 1, it is assumed that each semiconductor memory group includes two semiconductor memory devices.

The plurality of semiconductor memory devices included in the single sea conductor memory group may communicate with the controller 20 through the single common channel. For example, semiconductor memory devices 11_1 and 11_2 that are included in the first semiconductor memory group 11 communicate with the controller 20 through the first channel CH1. Further, semiconductor memory devices 1k_1 and 1k_2 that are included in the k-th semiconductor memory group 1k may communicate with the controller 20 through the k-th channel CHk.

The controller 20 may be coupled to a host and the plurality of semiconductor memory groups 11 to 1k. The controller 20 may control the general operation of the plurality of semiconductor memory groups 11 to 1k. Also, the controller 20 may provide an interface between the host and the plurality of semiconductor memory groups 11 to 1k. According to an exemplary embodiment, the controller 20 may drive firmware for controlling the plurality of semiconductor memory groups 11 to 1k.

Upon a request from the host or a request internally generated from the controller 20, the controller 20 may access a specific semiconductor memory group through a corresponding channel. For example, the controller 20 may control read, program, and erase operations of the specific semiconductor memory group through the corresponding channel. For example, during a program operation, the controller 20 may transfer a chip enable signal, a command, an address, and data to be programmed to the semiconductor memory devices of the specific semiconductor memory group through the corresponding channel.

Figure 2:
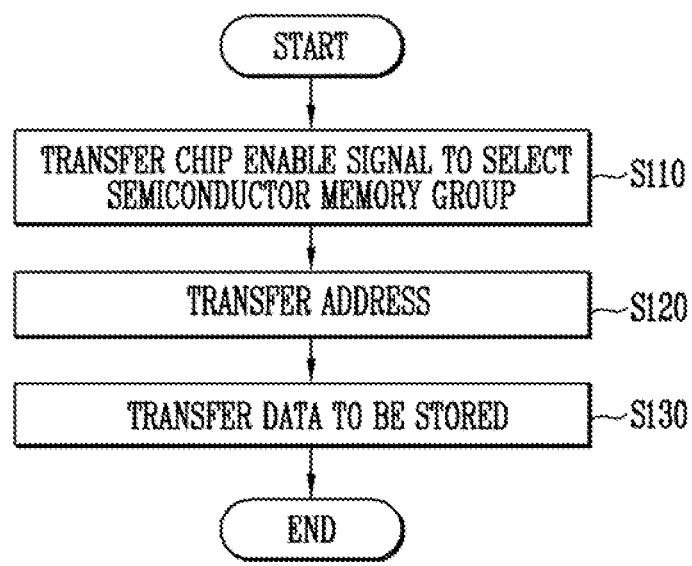
FIG. 2 is a flowchart illustrating method controlling the semiconductor memory devices by the controller shown in FIG. 1.

FIG. 2 is a flowchart illustrating a method of controlling the semiconductor memory devices 11_1 to 1k_1 and 11_2 to 1k_2 by the controller 20 shown in FIG. 1.

Referring to FIGS. 1 and 2, the controller 20 may to select a semiconductor memory group using chip enable signals at step S110. For example, the controller 20 may transfer a corresponding chip enable signal, which is activated, through the first channel CH1 to select the first semiconductor memory group 11. The semiconductor memory devices 11_1 and 11_2 of the first semiconductor memory group 11 may be activated in response to the corresponding chip enable signal. The remaining chip enable signals which are transferred through the remaining channels CH2 to CHk may be deactivated or activated.

The controller 20 may transfer an address to the semiconductor memory devices of the selected semiconductor memory group at step S120. The address may include one or more bits for selecting between the semiconductor memory devices (e.g. 11_1 and 11_2) of the selected semiconductor memory group (e.g. 11). For example, when an address includes eight bits, a first bit may be used to select one of the two semiconductor memory devices. The remaining bits of the address may be allocated to indicate a region where data are stored in a memory cell array of the selected semiconductor memory device.

The controller 20 may further transfer a command. The command may be provided before an address is transferred. During a program operation, a command indicating the program operation (e.g., an 80 h command for flash memory) may be transferred.

The controller 20 may transfer data to be stored at step S130. The selected semiconductor memory device (e.g., 11_1) may store the data to be transferred in a region, which is specified by the address, of the memory cell array thereof.

Figure 3:
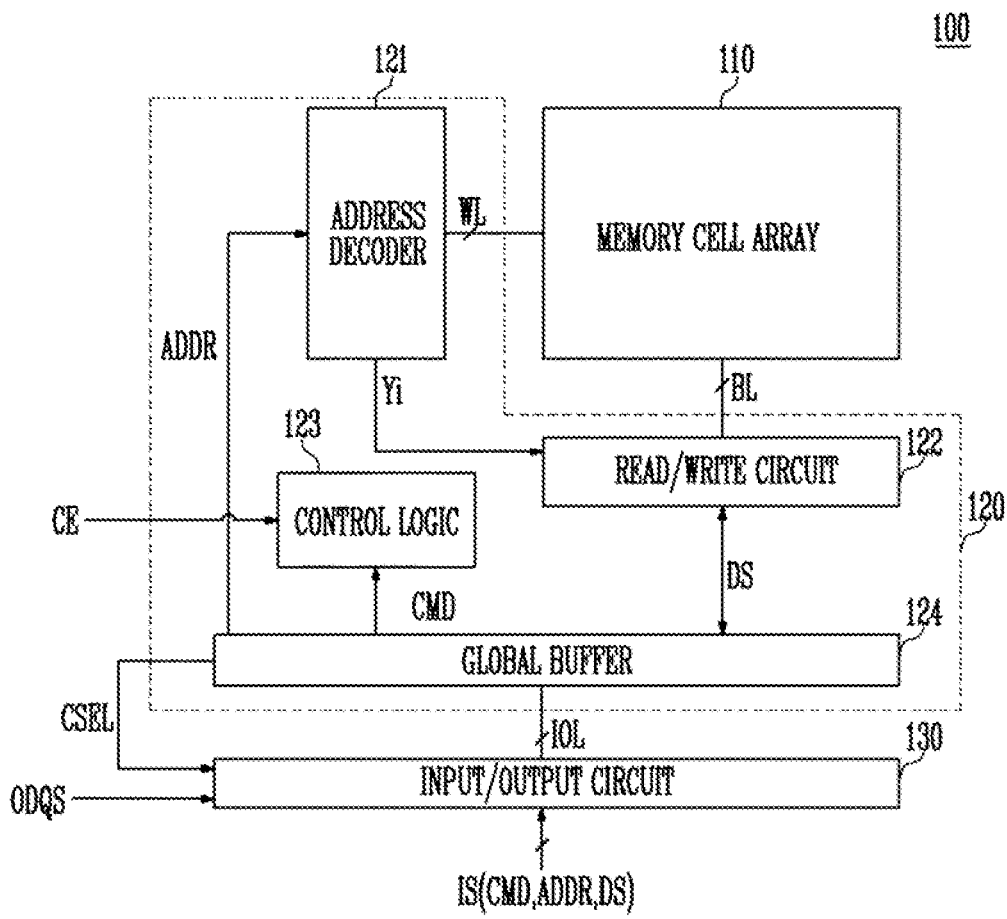
FIG. 3 is a block diagram illustrating a semiconductor memory device according to an embodiment of the present invention.

FIG. 3 is a block diagram illustrating a semiconductor memory device 100 according to an embodiment of the present invention. Hereinafter, it is assumed that the semiconductor memory device 100, shown in FIG. 3, is one of the semiconductor memory devices 11_1 to 1k_1 and 11_2 to 1k_2 shown in FIG. 1.

Referring to FIG. 3, the semiconductor memory device 100 may include a memory cell array 110, peripheral circuits 120 and an input/output circuit 130.

The memory cell array 110 may be coupled to an address decoder 121 of the peripheral circuits 120 through word lines WL and coupled to a read/write circuit 122 of the peripheral circuits 120 through bit lines BL.

The memory cell array 110 may include a plurality of memory blocks. The plurality of memory blocks may include a plurality of memory cells. The plurality of memory cells may be non-volatile memory cells.

Memory cells arranged in a row direction may share a word line, while memory cells arranged in a column direction may share a bit line. For example, memory cells arranged in a column may form a cell string, and each cell string may be coupled to each bit line.

An erase operation of the semiconductor memory device 100 may be performed in units of memory blocks. A program operation and a read operation of the semiconductor memory device 100 may be performed in units of pages. For example, memory cells coupled to a word line of a single memory block may form a page.

The peripheral circuits 120 may include an address decoder 121, a read/write circuit 122, a control logic 123, and a global buffer 124.

The address decoder 121 may be coupled to the memory cell array 110 through the word lines WL. The address decoder 121 may operate in response to control of the control logic 123. The address decoder 121 may receive an address ADDR from the global buffer 124.

The address decoder 121 may decode a block address of the received address ADDR to select at least one memory block according to the decoded block address.

The address decoder 121 may decode a row address of the received address ADDR. The address decoder 121 may control voltages of the word lines WL according to the decoded row address. For example, different voltages may be supplied to a word line selected by the row address and a word line not selected by the row address. The address decoder 121 may decode a column address of the received address ADDR and transfer a decoded column address Yi to the read/write circuit 122.

According to an example, the address decoder 121 may include a block decoder, a row decoder, a column decoder and an address buffer.

The read/write circuit 122 may be coupled to the memory cell array 110 through the bit lines BL. The read/write circuit 122 may operate according to control of the control logic 123. The read write circuit 122 may communicate data signals DS with the global buffer 124. The data signals DS may correspond to data to be programmed in the memory cell array 110 or data read from the memory cell array 110. During a program operation, the read/write circuit 122 may receive the data signals DS and perform a program operation on memory cells of a selected word line in response to the received data signals DS. During a read operation, the read/write circuit 122 may read the data from the memory cells of the selected word line and output the data signals DS in response to data corresponding to the decoded column address Yi from the read data.

According to an exemplary embodiment, the read/write circuit 122 may include page buffers (or page registers), a column selection circuit, and a data input/output buffer. The data input/output buffer may buffer the data signals DS.

The control logic 123 may be coupled to the address decoder 121, the read/write circuit 122, the global buffer 124 and the input/output circuit 130. The control logic 123 may receive a command CMD from the global buffer 124. The control logic 123 may be configured to control the general operation of the semiconductor memory device 100 in response to the command CMD.

The control logic 123 may receive a chip enable signal CE that is transferred from the controller 20 (see FIG. 1). The chip enable signal CE may be transferred through the channel coupled to the semiconductor memory device 100. Since the semiconductor memory device 100 is one of the semiconductor memory devices 11_1 and 11_2 of the first semiconductor memory group 11 shown in FIG. 1, the chip enable signal CE may be transferred through the first channel CH1. The control logic 123 may enable or disable the semiconductor memory device 100 in response to the chip enable signal CE. When the chip enable signal CE is activated (e.g., when the chip enable signal CE has a 'high' logic value), the semiconductor memory device 100 may be enabled. When the chip enable signal CE is deactivated (e.g., when the chip enable signal CE has a "low" logic value), the semiconductor memory device 100 may be disabled.

The global buffer 124 may be coupled to the input/output circuit 130 through input/output lines IOL. The global buffer 124 may receive input signals IS from the input/output circuit 130. The global buffer 124 may determine whether the received input signals IS are the command CMD, the address ADDR, or the data signals DS. Though not illustrated in FIG. 3, the global buffer 124 may perform a determination operation in response to a command latch enable (CLE) signal, an address latch enable (ALE) signal, and a write enable (WE) signal that are transferred from the controller 20 to the semiconductor memory device 100. As a result of the determination, the global buffer 124 may transfer the command CMD to the control logic 123, transfer the address ADDR to the address decoder 121, and transfer the data signals DS to the read/write circuit 122.

As described above with reference to FIG. 2, an address and a command may be transferred before the data signals DS are transferred from the controller 20. When receiving the address ADDR from the input/output circuit 130, the global buffer 124 may generate a chip selection signal CSEL based on the address ADDR. According to an exemplary embodiment, the address ADDR may include a bit for selecting between the semiconductor memory devices 11_1 and 11_2 of the first semiconductor memory group 11. The global buffer 124 may activate or deactivate the chip selection signal CSEL based on the bit of the address ADDR. For example, when the bit has a "high" logic value to select the first semiconductor memory device 11_1, the chip selection signal CSEL of the first semiconductor memory device 11_1 may be activated and the chip selection signal CSEL of the second semiconductor memory device 11_2 may be deactivated. Meanwhile, when the bit has a "low" logic value to select the second semiconductor memory device 11_2, the chip selection signal CSEL of the first semiconductor memory device 11_1 may be deactivated and the chip selection signal CSEL of the second semiconductor memory device 11_2 may be activated.

The input/output circuit 1303 may receive the input signals IS from the controller 20. For example, the input/output circuit 130 may receive the command CMD, the address ADDR and the data signals DS as the input signals IS. The input/output circuit 130 may transfer the command CMD and the address ADDR to the global buffer 124.

According to an embodiment of the present invention, the input/output circuit 130 may receive the chip selection signal CSEL from the peripheral circuits 120. In FIG. 3, the input/output circuit 130 may receive the chip selection signal CSEL from the global buffer 124. The input/output circuit 130 may be configured to transfer the data signals DS to the global buffer 124 or block the data signals DS in response to the chip selection signal CSEL.

According to another embodiment of the present invention, the chip selection signal CSEL may be applied from another component of the semiconductor memory device 100. For example, the chip selection signal CSEL may be applied from an address buffer in the address decoder 121. The address decoder 121 may carry out the function of providing the chip selection signal CSEL.

The input/output circuit 130 may further receive an original data strobe signal ODQS from the controller 20 through the first channel CH1. The original data strobe signal ODQS may be a pulse signal. The input/output circuit 130 may be configured to transfer the data signals DS to the global buffer 124 through input/output lines IOL in response to the original data strobe signal ODQS. For example, the input/output circuit 130 may transfer the data signals DS to the global buffer 124 when the original data strobe signal ODQS is transitioned from a "low" logic value to a "high" logic value (hereinafter, referred to as "high transition"). Meanwhile, the input/output circuit 130 may transfer the data signals DS to the global buffer 124 when the original data strobe signal ODQS is transitioned from a "high" logic value to a "low" logic value (hereinafter, referred to as "low transition"). Furthermore, the input/output circuit 130 may transfer the data signals DS to the global buffer 124 in response to both the high transition and the low transition of the original data strobe signal ODQS. Various changes may be made to the method of transferring data signals DS in response to the original data strobe signal ODQS.

According to an exemplary embodiment, the semiconductor memory device 100 may be a NAND type flash memory.

Figure 4:
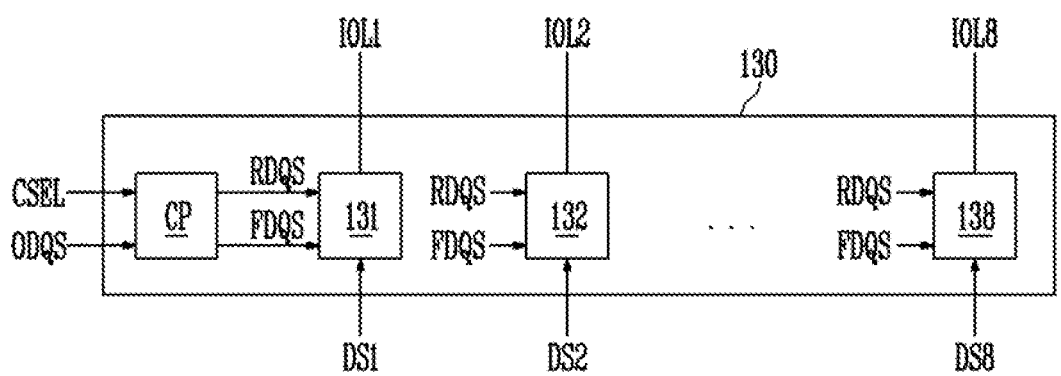
FIG. 4 is a detailed diagram illustrating an example embodiment of an input/output circuit shown in FIG. 3.
Figure 5:
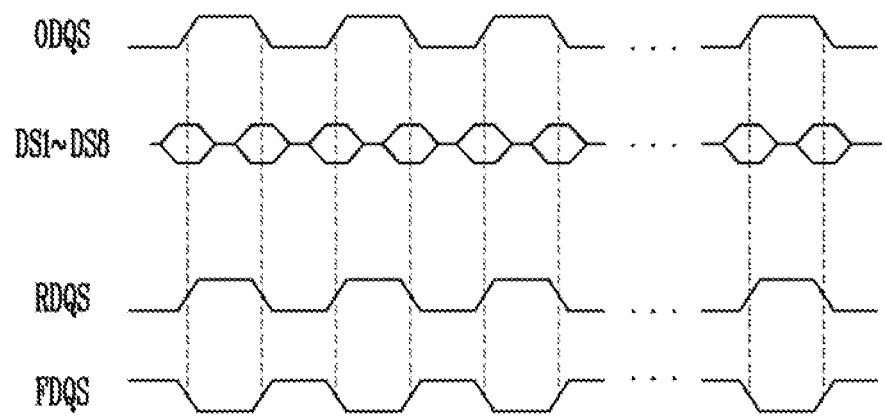
FIG. 5 is a timing diagram illustrating the relationship between an original data strobe signal and data signals.

FIG. 4 is a detailed diagram illustrating an exemplary embodiment of the input/output circuit 130 shown in FIG. 3. FIG. 5 is a timing diagram illustrating the relationship between the original data strobe signal ODQS and data signals DS1 to DS8.

Referring to FIGS. 3 and 4, the input/output circuit 130 may include a control pad circuit CP and first to eighth input/output pad circuits 131 to 138.

The control pad circuit CP may receive the original data strobe signal ODQS from an exterior (e.g., controller 20 in FIG. 1). The control pad circuit CP may be configured to generate a rising data strobe signal RDQS and a falling data strobe signal FDQS based on the original data strobe signal ODQS. Referring to FIG. 5 the rising data strobe signal RDQS may be substantially the same as the original data strobe signal ODQS. The falling data strobe signal FDQS may be an inverted signal of the original data strobe signal ODQS.

Referring again to FIG. 4, the rising data strobe signal RDQS and the falling data strobe signal FDQS may be transferred to the first to eighth input/output pad circuits 131 to 138.

The first to eighth input/output pad circuits 131 to 138 may receive the first to eighth data signals DS1 to DS8, respectively. The first to eighth data signals DS1 to DS8 may form the data signals DS shown in FIG. 3. In other words, the data signals DS in FIG. 3 may be received in units of eight bits. The first to eighth input/output pad circuits 131 to 138 may be coupled to the first to eighth input/output lines IOL1 to IOL8, respectively. Each of the first to eighth input/output pad circuits 131 to 138 may transfer a data signal received through a corresponding one of the input/output lines.

Each of the input/output pad circuits 131 to 138 may receive the rising data strobe signal RDQS and the falling data strobe signal FDQS. The input/output pad circuits 131 to 138 may transfer the data signals DS1 to DS8, respectively, in response to the rising data strobe signal RDQS and the falling data strobe signal FDQS. Referring to FIG. 5, the input/output pad circuits 131 to 138 may receive and transfer the data signals DS1 to DS8 in response to the high transition of the rising data strobe signal RDQS. In addition, the input/output pad circuits 131 to 138 may receive and transfer the data signals DS1 to DS8 in response to the high transition of the falling data strobe signal FDQS. As a result, the input/output circuit 130 may receive and transfer the data signals DS1 to DS8 in response to both the high transition and the lour transition of the original data strobe signal ODQS.

Referring again to FIG. 4, the control pad circuit CP may receive the chip selection signal CSEL from the peripheral circuits 120. According to an exemplary embodiment, the control pad circuit CP may be configured to supply or block the rising data strobe signal RDQS and the failing data strobe signal FDQS in response to the chip selection signal CSEL.

When the rising data strobe signal RDQS and the falling data strobe signal FDQS are blocked, the first to eighth data signals DS1 to DS8 may not be transferred to the peripheral circuits 120. When the rising data strobe signal RDQS and the falling data strobe signal FDQS are provided, the first to eighth data signals DS1 to DS8 may be transferred to the peripheral circuits 120.

According to an exemplary embodiment, the rising and falling data strobe signals RDQS and FDQS for transferring the data signals DS1 to DS8 may not be applied in response to the chip selection signal CSEL. When the rising data strobe signal RDQS and the falling data strobe signal FDQS are not applied, the data signals DS1 to DS8 may not be applied to the peripheral circuits 120 (see FIG. 3) through the input/output lines IOL. When the semiconductor memory device 100 is not selected, current flowing through the input/output lines IOL may be interrupted. Therefore, power consumption of the semiconductor memory device 100 may be reduced.

Figure 6:
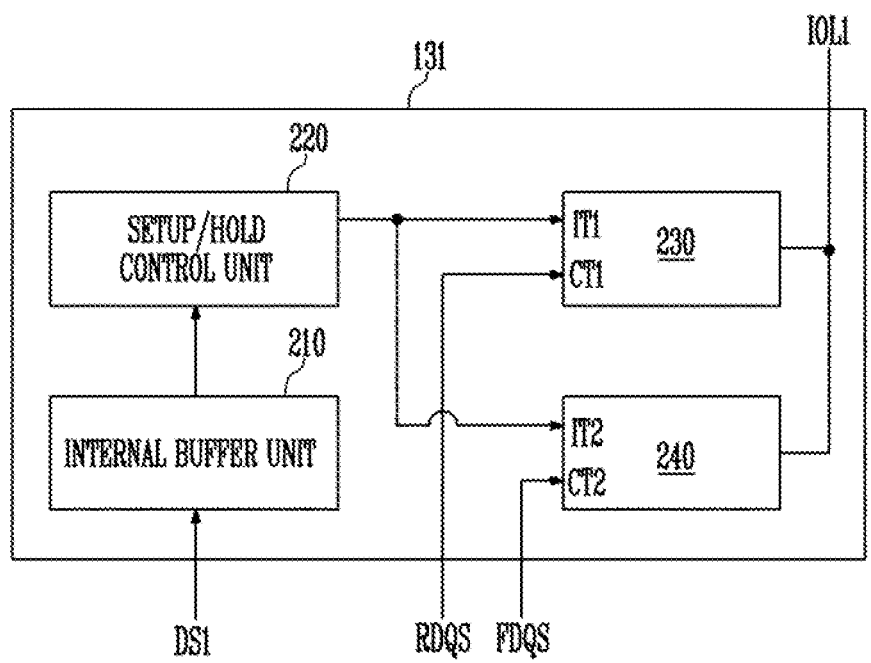
FIG. 6 is a detailed diagram illustrating of the first input/output pad circuit shown in FIG. 4.

FIG. 6 is a detailed diagram illustrating the first input/output pad circuit 131 shown in FIG. 4.

Referring to FIGS. 4 and 6, the first input/output pad circuit 131 may include an internal buffer unit 210, a setup/hold control unit 220, and first and second output units 230 and 240.

The internal buffer unit 210 may receive the first data signal DS1. The internal buffer unit 210 may buffer the first data signal DS1 and transfer the first data signal DS1 to the setup/hold control unit 220.

The setup/hold control unit 220 may control phase of the first data signal DS1, so that a timing margin for obtaining a logic value of the first data signal DS1, corresponding to the high transitions of the rising and falling data strobe signals RDQS and FDQS, may be secured. For example, the phase of the first data signal DS1 may be controlled so that a setup time, for which the logic value of the first data signal DS1 is maintained before the high transitions of the rising and falling data strobe signals RDQS and FDQS, may coincide with a hold time for which the logic value of the first data signal DS1 is maintained after the high transitions of the rising and falling data strobe signals RDQS and FDQS.

The first output unit 230 may receive the first data signal DS1 output from the setup/hold control unit 220 through a first input terminal IT1. The second output unit 240 may receive the first data signal DS1 output from the setup hold control unit 220 through a second input terminal IT2. The first output unit 230 may receive the rising data strobe signal RDQS through a first clock terminal CT1 and output the first data signal DS1 through the first input/output line IOL1 in response to the high transition of the rising data strobe signal RDQS. In other words, the first output unit 230 may output the first data signal DS1, which is synchronized with the rising data strobe signal RDQS. The second output unit 240 may receive the falling data strobe signal FDQS through a second clock terminal CT2 and output the first data signal DS1 through the first input/output line IOL1 in response to the high transition of the falling data strobe signal FDQS. According to an exemplary embodiment, each of the first and second output units 230 and 240 may include a flip-flop.

When the rising data strobe signal RDQS and the falling data strobe signal FDQS are blocked (for example, each of the rising data strobe signal RDQS and the falling data strobe signal FDQS is maintained at a "low" logic value), the first data signal DS1 may not be output. The rising data strobe signal RDQS and the falling data strobe signal FDQS may be provided from the control pad circuit CP shown in FIG. 4.

Figure 7:
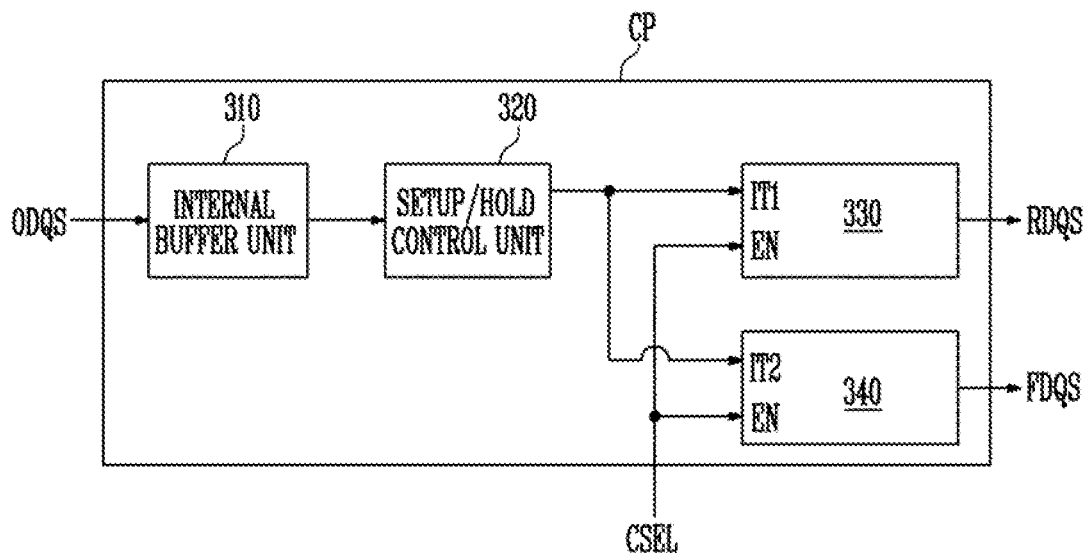
FIG. 7 is a block diagram illustrating the control pad circuit shown in FIG. 4.

FIG. 7 is a block diagram illustrating the control pad circuit CP shown in FIG. 4.

Referring to FIGS. 4 and 7, the control pad circuit CP may include an internal buffer unit 310, a setup hold control unit 320, and first and second output units 330 and 340.

The internal buffer unit 310 may buffer the original data strobe signal ODQS. The setup/hold control unit 320 may control a phase of the original data strobe signal ODQS so that a setup time and a hold time of the rising data strobe signal RDQS and the falling data strobe signal FDQS may be secured.

The first and second output units 330 and 340 may receive the original data strobe signal ODQS output from the setup/hold control unit 220. The first and second output units 330 and 340 may further receive the chip selection signal CSEL. The first output unit 330 may output the original data strobe signal ODQS as the rising data strobe signal RDQS when the chip selection signal CSEL is activated. The second output unit 340 may invert the original data strobe signal ODQS to output the falling data strobe signal FDQS when the chip selection signal CSEL is activated. When the chip selection signal CSEL is deactivated, "low" logic values of the rising data strobe signal RDQS and the falling data strobe signal FDQS may be maintained.

Figure 8:
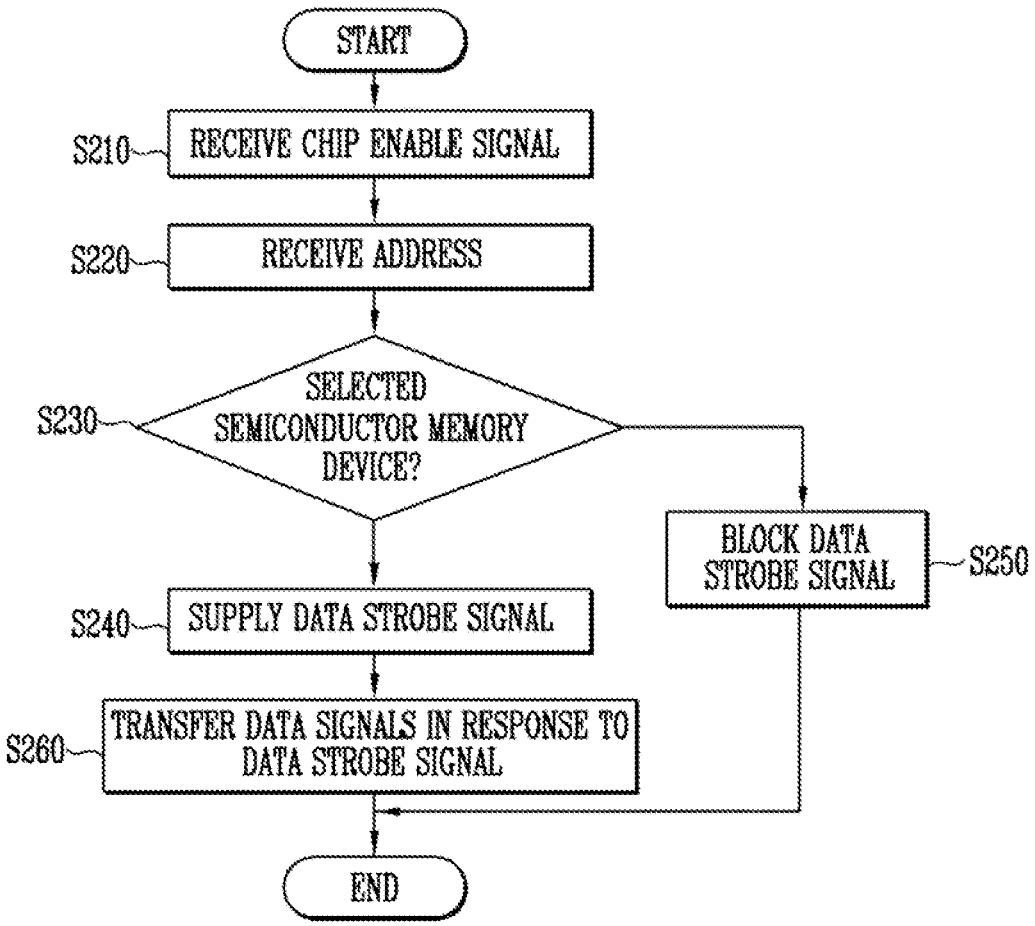
FIG. 8 is a flowchart illustrating a method of operating a semiconductor memory device according to the embodiment of the present invention.

FIG. 8 is a flowchart illustrating a method of operating the semiconductor memory device 100 according to the embodiment of the present invention.

Referring to FIGS. 3 and 8, the semiconductor memory device 100 may receive the chip enable signal CE at step S210. The semiconductor memory device 100 may be enabled in response to the activated chip enable signal CE.

The semiconductor memory device 100 may receive the address ADDR at step S220. At step S230, it is determined whether or not the semiconductor memory device 100 is a selected semiconductor memory device based on the address ADDR. As a result of the determination, the chip selection signal CSEL may be generated. When it is determined that the semiconductor memory device 100 is the selected semiconductor memory device, the process proceeds to step S240. Otherwise, the process proceeds to step S250.

At step S240, the rising and falling data strobe signals RDQS and FDQS (see FIG. 4) may be supplied to the input/output pad circuits 131 to 138 (see FIG. 4). The rising and falling data strobe signals RDQS and FDQS may be blocked at step S250.

At step S260, when the rising and falling data strobe signals RDQS and FDQS are applied, the input/output pad circuits 131 to 138 (see FIG. 4) may transfer the data signals DS1 to DS8 to the peripheral circuits 120 in response to the rising and falling data strobe signals RDQS and FDQS.

According to the embodiment of the present invention, when the semiconductor memory device 100 is not selected, the data signals DS1 to DS8 may not be transferred to the peripheral circuits 120. Since current for transferring the data signals DS1 to DS8 does not flow through the input/output lines IOL, power consumption of the semiconductor memory device 100 may be reduced.

Figure 9:
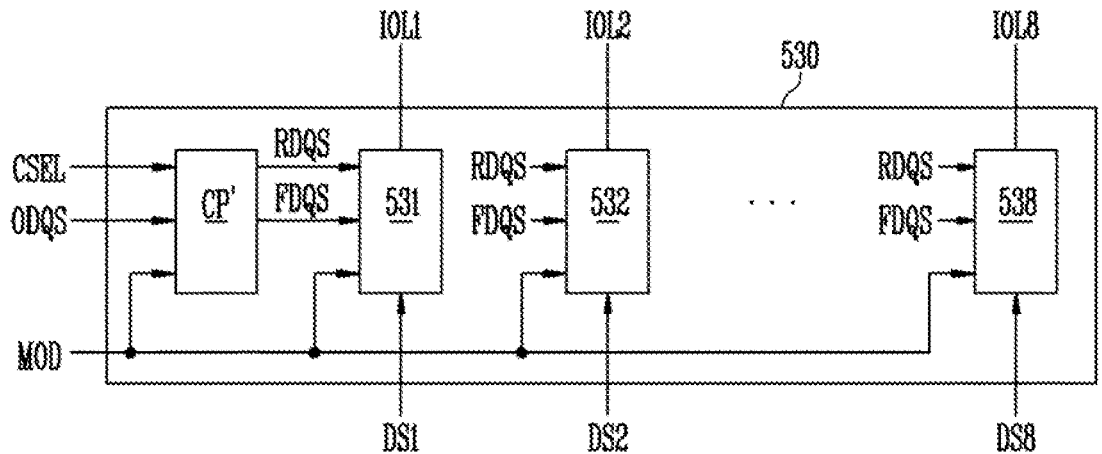
FIG. 9 is a block diagram illustrating another example embodiment of the input/output circuit shown in FIG. 3.

FIG. 9 is a block diagram illustrating another example embodiment of the input/output circuit shown in FIG. 3.

Referring to FIGS. 3 and 9, an input/output circuit 530 may have substantially the same configuration as the input/output circuit 130 described above with reference to FIG. 4 except that the input/output circuit 530 receives a mode signal MOD. Hereinafter, a description of the contents of the input/output circuit 530, which is substantially the same as those of the input/output circuit 130 described with reference to FIG. 4, is omitted.

The input/output circuit 530 may receive the mode signal MOD. A control pad circuit CP′ and first to eighth input/output pad circuits 531 to 538 may receive the mode signal MOD. According to the mode signal MOD, it is determined whether the data signals DS1 to DS8 are received in a synchronous mode or an asynchronous mode. When the data signals DS1 to DS8 are received in a synchronous mode, it means that the original data strobe signal ODQS is also applied when the data signals DS1 to DS8 are received. When the data signals DS1 to DS8 are received in an asynchronous mode, it means that the original data strobe signal ODQS is not applied.

According to an exemplary embodiment, the mode signal MOD may be applied from the controller 20 (see FIG. 1). According to another example, the mode signal MOD may be a signal that is generated by the semiconductor memory device 100. In the case, the semiconductor memory device 100 may activate or deactivate the mode signal MOD according to whether or not the original data strobe signal ODQS is applied. Furthermore, the mode signal MOD may be generated by the peripheral circuits 120 or the input/output circuit 130.

Figure 10:
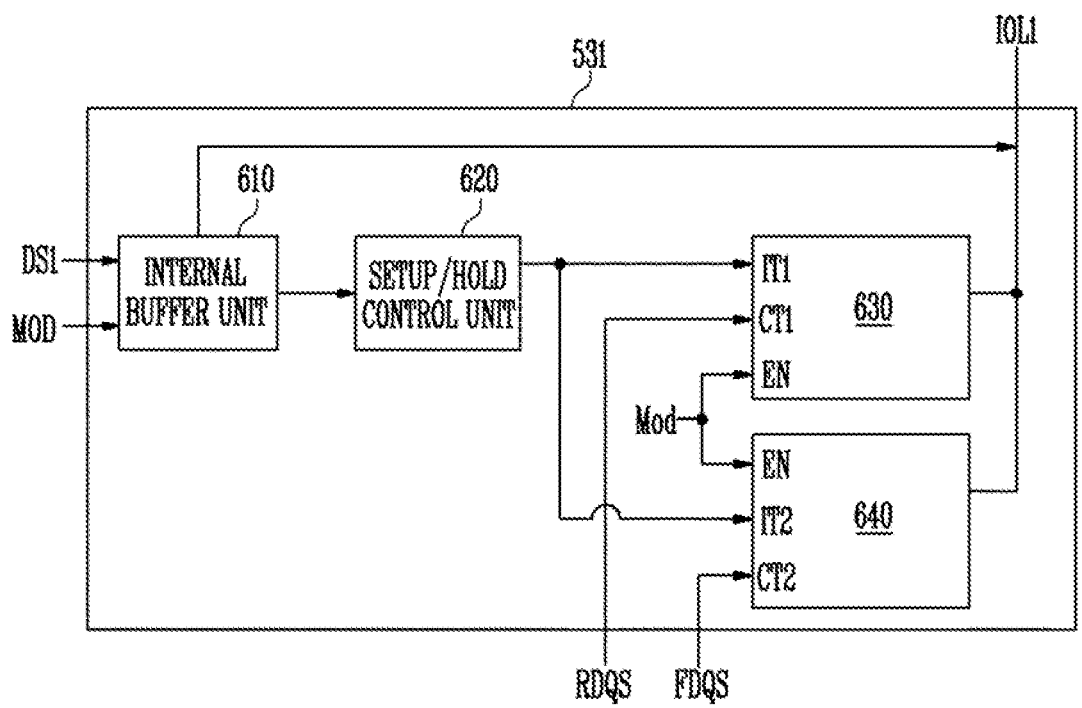
FIG. 10 is a detailed diagram illustrating the first input/output pad circuit shown in FIG. 9.

FIG. 10 is a detailed diagram illustrating the first input/output pad circuit 531 shown in FIG. 9.

Referring to FIGS. 9 and 10, the first input/output pad 531 may include an internal buffer unit 610, a setup/hold control unit 620, and first and second output units 630 and 640. The first input/output pad 531 may have substantially the same configuration as the first input/output pad circuit 131 shown in FIG. 6 except that the internal buffer unit 610 and the first a id the second output units 630 and 640 receive the mode signal MOD, respectively. Hereinafter, a description of the contents of the first input/output pad 531, which is substantially the same as those of the first input/output pad circuit 131, is omitted.

The internal buffer unit 510 may receive the first data signal DS1 and the mode signal MOD. The internal buffer unit 610 may transfer the first data signal DS1 to the setup/hold control unit 620 or output the first data signal DS1 to the first input/output line IOL1 in response to the mode signal MOD. In other words, when the data signal DS1 is received from the controller 20 (see FIG. 1) in an asynchronous mode, the first data signal DS1 may be directly output to the first input/output line IOL1. When the first data signal DS1 is received from the controller 20 in a synchronous mode, the first data signal DS1 may be applied to the first and second output units 630 and 640 through the setup/hold control unit 620. When the data signal DS1 is received from the controller 20 in an asynchronous mode, unlike the case shown in FIG. 10, the first data signal DS1 may be output to the first input/output line IOL1 through a separate flip-flop (not illustrated).

Figure 11:
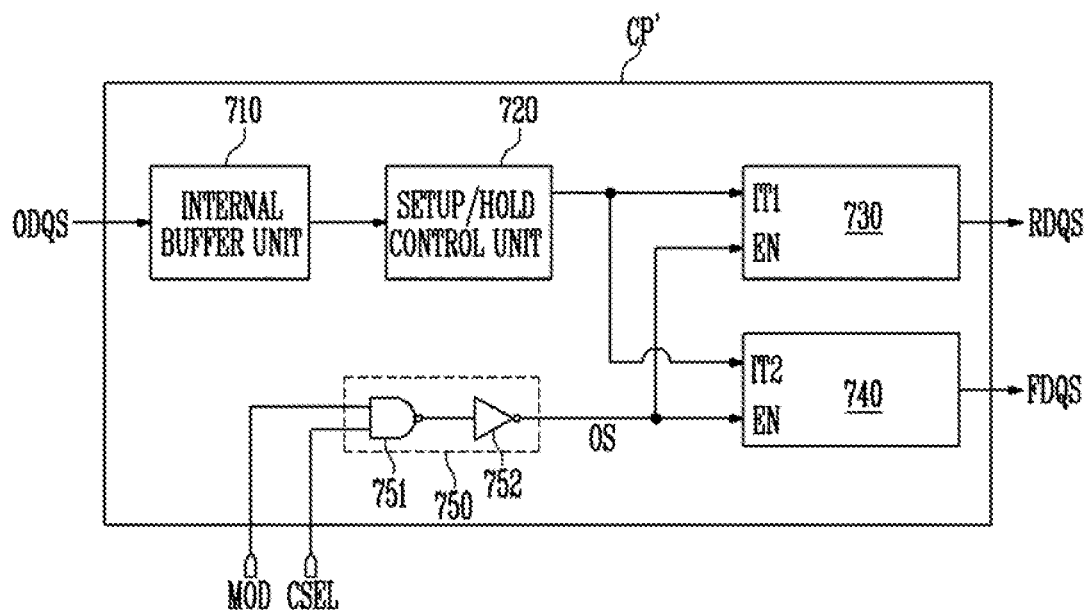
FIG. 11 is a detailed diagram illustrating the control pad circuit shown in FIG. 9.

FIG. 11 is a detailed diagram of the control pad circuit CP′ shown in FIG. 9.

Referring to FIGS. 9 and 11, the control pad circuit CP′ may include an internal buffer unit 710, a setup/hold control unit 720, first and second output units 730 and 740, and a logic operation unit 750. The control pad circuit CP′ may have substantially the same configuration as the control pad circuit CP shown in FIG. 7 except for the logic operation unit 750. Hereinafter, a description of the contents of the control pad circuit CP′, which is substantially the same as those of the control pad circuit CP shown in FIG. 7, is omitted.

The logic operation unit 750 may generate an activated output signal OS when the mode signal MOD and the chip selection signal CSEL are activated. In other words, when the data signals DS1 to DS8 are received from the controller 20 (see FIG. 1) in a synchronous mode, and the semiconductor memory device 100 (see FIG. 3) is selected, the logic operation unit 750 may generate the activated output signal OS. The logic operation unit 750 may generate a deactivated output signal OS when one of the mode signal MOD and the chip selection signal CSEL is deactivated.

Hereinafter, is assumed that the mode signal MOD has a "high" logic value when the mode signal MOD is activated, and the chip selection signal CSEL has a "high" logic value when the chip selection signal CSEL is activated.

The logic operation unit 750 may include a NAND gate 751 and an inverter 752. The NAND gate 751 may perform a NAND operation of the mode signal MOD and the chip selection signal CSEL. An output signal from the NAND gate 751 may be input to the inverter 752. The inverter 752 may transfer an inverted output signal of the NAND gate 751 to the first and second output units 730 and 740. Therefore, when both the mode signal MOD and the chip selection signal CSEL have "high" logic values, the output signal OS having a "high" logic value may be generated.

The first and second output units 730 and 740 may be enabled when the output signal OS has a "high" logic value and may be disabled when the output signal OS has a "low" logic value. When the first output unit 730 is enabled, the rising data strobe signal RDQS may be toggled (not blocked).

When the second output unit 740 is enabled, the falling data strobe signal FDQS may be toggled (not blocked).

With reference to FIG. 11, a description has been made to an example in which the logic operation unit 750 includes the NAND gate 751 and the inverter 752. However, various changes may be made to the configuration of the logic operation unit 750.

When the mode signal MOD is applied, the semiconductor memory device 100 may receive the data signals DS1 to DS8 from the controller 20 in a synchronous mode or an asynchronous mode. According to an exemplary embodiment, when the data signals DS1 to DS8 are received, the data signals DS1 to DS8 may not be applied to the peripheral circuits 120 when the semiconductor memory device 100 is not selected. Therefore, power consumption of the semiconductor memory device 100 may be reduced.

Figure 12:
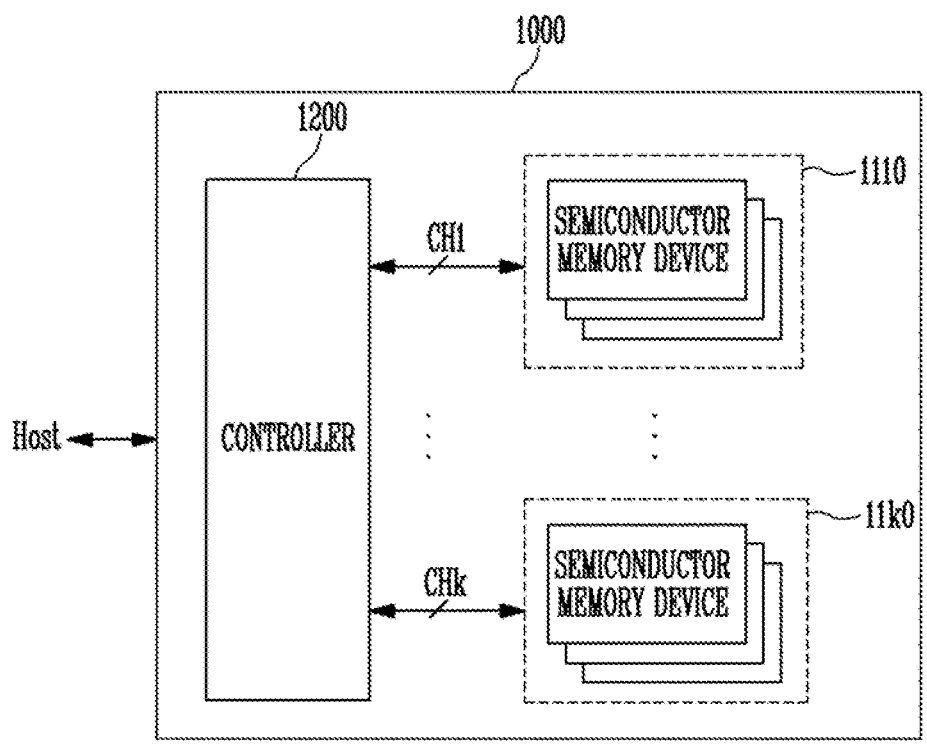
FIG. 12 is a block diagram illustrating a memory system according to another embodiment of the present invention.

FIG. 12 is a block diagram illustrating a memory system 1000 according to another embodiment of the present invention.

Referring to FIG. 12, a memory system 1000 may include a plurality of semiconductor memory groups 1110 to 11$k$0 and a controller 1200. The plurality of semiconductor memory groups 1110 to 11$k$0 may be coupled to a controller 2200 through the first to k-th channels CH1 to CHk, respectively. Each of the semiconductor memory groups may include at least three semiconductor memory devices. The plurality of semiconductor memory devices included in the single semiconductor memory group may communicate with the controller 1200 through the single common channel. Each of the semiconductor memory devices may have substantially the same configuration as the semiconductor memory device 100 described above with reference to FIG. 3.

An address that is transferred from the controller 1200 through each channel may include bits for selecting any one of the semiconductor memory devices included in a corresponding semiconductor memory group. The bits for selecting one of the semiconductor memory devices may include at least two bits.

The controller 1200 may control the general operation of the semiconductor memory devices included in the memory system 1000. According to an exemplary embodiment, the controller 1200 may include components such as a processing unit, Random Access Memory (RAM), a host interface and a memory interface.

The processing unit may control the general operation of the controller 1200.

RAM may be used as at least one of an operating memory of the processing unit, a cache memory between the semiconductor memory groups 1110 to 11$k$0 and a host, and a buffer memory between the semiconductor memory groups 1110 to 11$k$0 and the host.

The host interface may include a data exchange protocol between the host and the controller 1200. According to an exemplary embodiment, the controller 1200 may be configured to communicate with an external source (e.g., a host) through at least one of various interface protocols such as a Universal Serial Bus (USB) protocol, a Multi-Media Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol and an Integrated Drive Electronics (IDE) protocol. The memory interface may interface with the semiconductor memory device 1100. For example, the memory interface may include a NAND interface or a NOR interface.

The memory system 1000 may further include an error correction code (ECC) block. The ECC block may detect and correct errors included in a data read from the semiconductor memory device 1100. According to an exemplary embodiment, the ECC block may be provided as one of the components of the controller 1200.

The controller 1200 and the semiconductor memory groups 1110 to 11$k$0 may be integrated into a single device. According to an exemplary embodiment, the controller 1200 and the semiconductor memory groups 1110 to 11$k$0 may be integrated into a single device to form a memory card. For example, the controller 1200 and the semiconductor memory groups 1110 to 11$k$0 may be integrated into a single device to form a memory card such as a personal computer memory card international association (PCMCIA) card, a compact flash (CF) card, a smart media card (SM, SMC), a memory stick, a multi media card (MMC, RS-MMC, MMC micro), an SD card (SD, Mini-SD, Micro-SD, SDHC) and universal flash storage (UFS).

The controller 1200 and the semiconductor memory groups 1110 to 11$k$0 may be integrated into a single device to form a Solid State Drive (SSD). The SSD may include a storage configured to store data in a semiconductor memory. When the memory system 1000 is used as the SSD, an operation speed of the host coupled to the memory system 1000 may be significantly improved.

According to another embodiment, the memory system 1000 may be used as a computer, an Ultra Mobile PC (UMPC), a workstation, a net-book, Personal Digital Assistants (PDAs), a portable computer, a web tablet, a wireless phone, a mobile phone, a smart phone, an e-book, a portable multimedia player (PMP), a portable game machine, a navigation system, a black box, a digital camera, a 3-dimensional television, a digital audio recorder, a digital audio player, a digital picture recorder, a digital picture player, a digital video player, a device capable of wireless transmission and reception of information, various electronic devices constituting a home network, various electronic devices constituting a computer network, various electronic devices constituting a telematics network, an RFID device, or various electronic devices constituting a computing system.

According to an exemplary embodiment, the semiconductor memory groups 1110 to 11$k$0 or the memory system 1000 may be mounted using various types of packages. For example, the semiconductor memory device 1100 or the memory system 1000 may be packaged using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIL), Shrink Small Outline Package (SSOP), Thin Small Outline (TSOP), Thin Quad Flatpack (TQFP), System In Package (SIP), Multi Chip Package (MCP), Wafer-level Fabricated Package (WFP) and Wafer-Level Processed Stack Package (WSP).

Figure 13:
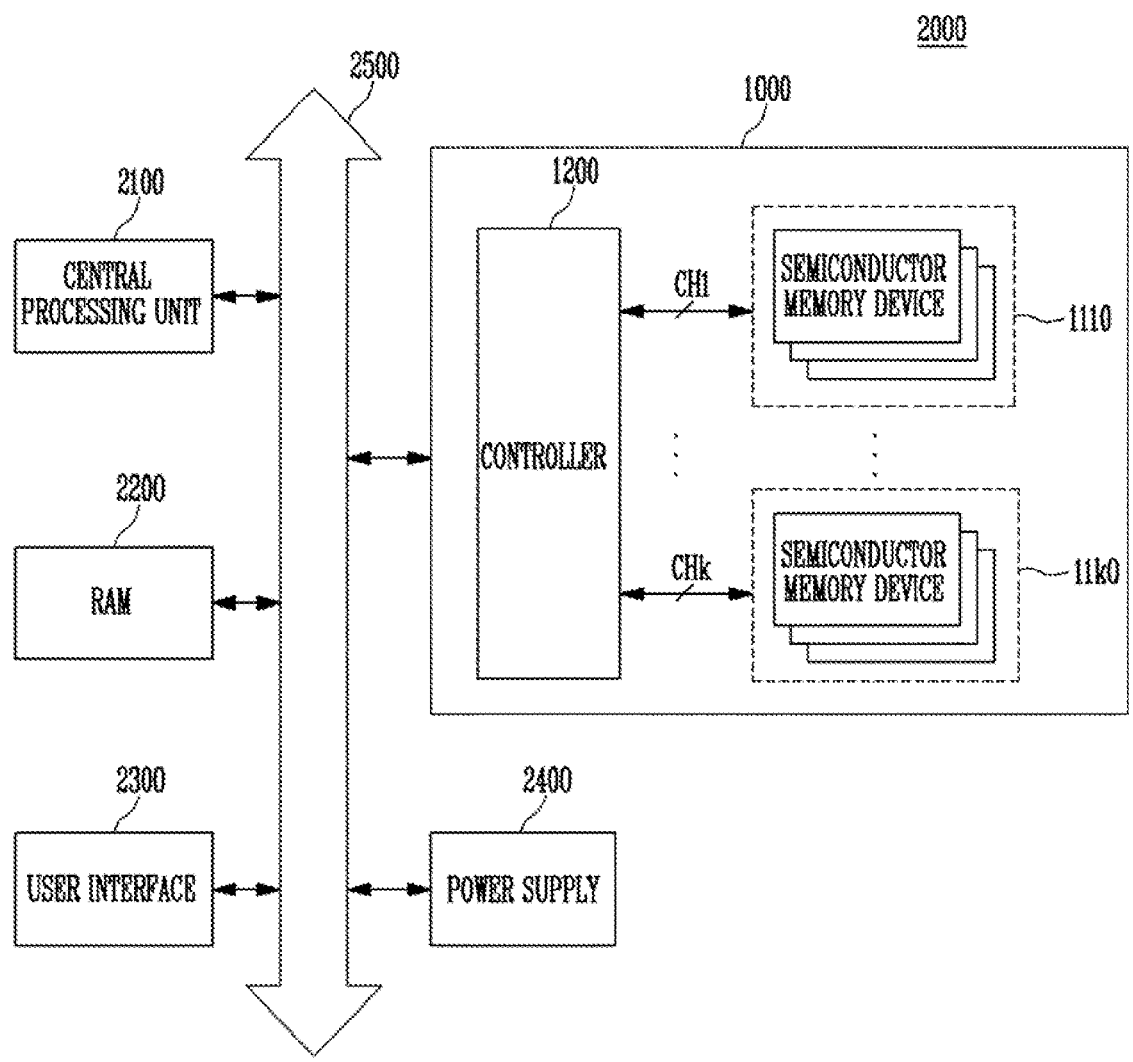
FIG. 13 is a block diagram illustrating a computing system 2000 including the memory system described with reference to FIG. 12.

FIG. 13 is a block diagram illustrating the computing system 2000 including the memory system 1000 described above with reference to FIG. 12. Referring to FIG. 13, the computing system 2000 may include a central processing, unit (CPU) 2100, Random Access Memory (RAM) 2200, a user interface 2300, a power supply 2400 a system bus 2500, and the memory system 1000.

The memory system 1000 may be coupled to the CPU 2100, the RAM 2200, the user interface 2300 and the power supply 2400 through a system bus 2500. Data provided through the user interface 2300 or processed by the CPU 2100 may be stored in the memory system 1000.

Referring to FIG. 13, the plurality of semiconductor memory devices of the memory system 1000 may be coupled to the system bus 2500 through the controller 1200. However, the plurality of semiconductor memory devices may be directly coupled to the system bus 2500. The functions of the controller 1200 may be performed by the CPU 2100 and the RAM 2200.

FIG. 13 illustrates the memory system 1000 described above with reference to FIG. 12. However, the memory system 1000 may be replaced by the memory system 1 described with reference to FIG. 1. According to an exemplary embodiment, the computing system 2000 may include both of the memory systems 1 and 1000 described with reference to FIGS. 1 and 12, respectively.

According to the embodiments of the present invention, data strobe signals for transferring data signals may be blocked in response to a chip selection signal indicating whether or not a semiconductor memory device selected. Therefore, when a semiconductor memory device is not selected, the data signals may not be applied to peripheral circuits therein. As a result, power consumption of the semiconductor memory device may be reduced.

According to embodiments of the present invention, a semiconductor memory device with reduced power consumption, a memory system including the same and an operating method thereof are provided.

What is claimed is:

1. A semiconductor memory device, comprising:
    an input/output circuit configured to receive an address and data from an exterior; and
    a peripheral circuit configured to receive the address through the input/output circuit and generate a chip selection signal based on the address,
    wherein the input/output circuit comprises:
    a control pad circuit configured to apply or block at least one data strobe signal in response to the chip selection signal; and
    one or more input/output pad circuits configured to transfer the data to the peripheral circuit in response to the at least one data strobe signal,
    wherein the control pad circuit is configured to receive an original data strobe signal from the exterior and apply the at least one data strobe signal based on the original data strobe signal, the at least one data strobe signal including a first data strobe signal that is substantially the same as the original data strobe signal and a second data strobe signal obtained by inverting the original data strobe signal.

2. The semiconductor memory device of claim 1, wherein the input/output pad circuits are configured to transfer the data to the peripheral circuit when the at least one data strobe signal is applied and block the data to the peripheral circuit when the at least one data strobe signal is blocked.

3. The semiconductor memory device of claim 1, wherein the control pad circuit comprises:
    a first output unit configured to output the original data strobe signal as the first data strobe signal when the chip selection signal is activated, wherein the first output unit is disabled when the chip selection signal is deactivated; and
    a second output unit configured to output an inverted signal of the original data strobe signal as the second data strobe signal when the chip selection signal is activated, wherein the second output unit is disabled when the chip selection signal is deactivated.

4. The semiconductor memory device of claim 1, wherein the control pad circuit further receives a mode signal activated when the data signals are applied along with the original data strobe signal, and
    the control pad circuit comprises:
    a logic operation unit configured to generate an output signal activated when the mode signal and the chip selection signal are activated;
    a first output unit configured to output the original data strobe signal as the first data strobe signal when the output signal is activated, wherein the first output unit is disabled when the output signal is deactivated; and
    a second output unit configured to output an inverted signal of the original data strobe signal as the second data strobe signal when the output signal is activated, wherein the second output unit is disabled when the output signal is deactivated.

5. The semiconductor memory device of claim 4, wherein the control pad circuit further comprises a setup/hold control unit configured to control a phase of the original data strobe signal before the original data strobe signal is applied to the first and second output units.

6. The semiconductor memory device of claim 1, wherein the control pad circuit is configured to apply the at least one data strobe signal when the chip selection signal is activated and block the at least one data strobe signal when the chip selection signal is deactivated.

7. The semiconductor memory device of claim 1, further comprising a memory cell array,
    wherein the peripheral circuit is configured to control the memory cell array, and
    the data is data to be programmed in the memory cell array.

8. A memory system, comprising:
    a first semiconductor memory group including semiconductor memory devices coupled to a first common channel; and
    a controller configured to transfer an address and data to the semiconductor memory devices through the first common channel,
    wherein each of the semiconductor memory devices comprises:
    a peripheral circuit configured to generate a chip selection signal in response to the address; and
    an input/output circuit configured to transfer the data to the peripheral circuit in response to at least one data strobe signal and selectively block the at least one data strobe signal in response to the chip selection signal,
    wherein the input/output circuit is configured to receive an original data strobe signal from the controller and apply the at least one data strobe signal based on the original data strobe signal, the at least one data strobe signal including a first data strobe signal that is substantially the same as the original data strobe signal and a second data strobe signal obtained by inverting the original data strobe signal.

9. The memory system of claim 8, further comprising a second semiconductor memory group coupled to a second common channel,
    wherein the controller is configured to transfer an activated chip enable signal through the first common channel or the second common channel to select the first semiconductor memory group or the second semiconductor memory group.

10. The memory system of claim 8, wherein the address includes one or more bits indicating one of the semiconductor memory devices.

11. The memory system of claim 10, wherein the peripheral circuit is configured to activate the chip selection signal in response to the one or more bits of the address.

12. The memory system of claim 8, wherein the input/output circuit is configured to output the at least one data strobe signal based on the original data strobe signal when the chip selection signal is activated and block the at least one data strobe signal when the chip selection signal is deactivated.

13. A method of operating each of semiconductor memory devices coupled to a common channel, the method comprising:
   receiving an address including one or more bits indicating one of the semiconductor memory devices and data through the common channel;
   enabling a chip selection signal in response to the one or more bits;
   internally blocking at least one data strobe signal generated based on an original data strobe signal from an exterior, in response to the chip selection signal; and
   internally blocking the data received through the common channel when the data strobe signal is blocked,
   wherein the at least one data strobe signal includes a first data strobe signal that is substantially the same as the original data strobe signal and a second data strobe signal obtained by inverting the original data strobe signal.

14. The method of claim 13, further comprising performing a program operation on memory cells corresponding to the address based on the data received through the common channel when the data strobe signal is supplied.

15. The method of claim 13, wherein the data is internally transferred when the at least one data strobe signal is toggled and the data is blocked when the at least one data strobe signal is blocked.

* * * * *

UNITED STATES PATENT AND TRADEMARK OFFICE
CERTIFICATE OF CORRECTION

PATENT NO.       : 8,971,135 B2                                Page 1 of 1
APPLICATION NO.  : 13/910502
DATED            : March 3, 2015
INVENTOR(S)      : Sang Oh Lim It is certified that error appears in the above-identified patent and that said Letters Patent is hereby corrected as shown below:

Title page:

Insert the Foreign Priority section as follows:

--(30)    Foreign Application Priority Data

Jun. 5, 2012    (KR) ............................ 10-2012-0060505--

Signed and Sealed this
Second Day of June, 2015

Michelle K. Lee
*Director of the United States Patent and Trademark Office*